(12) United States Patent
Rinke et al.

(10) Patent No.: US 9,918,411 B2
(45) Date of Patent: Mar. 13, 2018

(54) FLAP-BASED FORCED AIR COOLING OF DATACENTER EQUIPMENT

(71) Applicant: Rackspace US, Inc., San Antonio, TX (US)

(72) Inventors: Jordan Rinke, Live Oak, TX (US); Joel Wineland, Garden Ridge, TX (US)

(73) Assignee: Rackspace US, Inc., San Antonio, TX (US)

( * ) Notice: Subject to any disclaimer, the term of this patent is extended or adjusted under 35 U.S.C. 154(b) by 1068 days.

(21) Appl. No.: 13/721,737

(22) Filed: Dec. 20, 2012

(65) Prior Publication Data
US 2014/0179214 A1    Jun. 26, 2014

(51) Int. Cl.
*H05K 7/20* (2006.01)

(52) U.S. Cl.
CPC ..... *H05K 7/20836* (2013.01); *H05K 7/20727* (2013.01)

(58) Field of Classification Search
CPC ........... H05K 7/20727; H05K 7/20836; H05K 7/20709
USPC ...................................................... 454/184
See application file for complete search history.

(56) References Cited

U.S. PATENT DOCUMENTS

| | | | |
|---|---|---|---|
| 7,590,819 B2* | 9/2009 | Johnson | G06F 12/0292 711/203 |
| 7,599,183 B2* | 10/2009 | Dittus | H05K 7/20727 361/695 |
| 7,646,601 B2* | 1/2010 | Zhang | G06F 1/181 174/17 R |
| 7,688,593 B2* | 3/2010 | Byers | H05K 7/20572 165/104.33 |
| 7,855,886 B1* | 12/2010 | Chen | H05K 7/20172 361/679.48 |
| 7,893,038 B2* | 2/2011 | Gaserod | A23L 1/3002 514/23 |
| 7,902,966 B1* | 3/2011 | Beitelman | G06F 1/206 236/49.3 |
| 8,248,793 B2* | 8/2012 | Bash | H05K 7/20609 312/236 |
| 2005/0113015 A1* | 5/2005 | Crippen | H05K 7/2019 454/184 |
| 2006/0086119 A1 | 4/2006 | Malone et al. | |
| 2006/0176664 A1* | 8/2006 | Casebolt | H05K 7/20736 361/679.46 |
| 2007/0213000 A1* | 9/2007 | Day | H05K 7/20745 454/184 |
| 2007/0230119 A1 | 10/2007 | Baldwin | |
| 2009/0129016 A1 | 5/2009 | Hoeft et al. | |
| 2010/0282438 A1 | 11/2010 | Wirth et al. | |
| 2010/0314338 A1 | 12/2010 | Taylor | |
| 2011/0036554 A1* | 2/2011 | Scheidler | G06F 1/20 165/281 |
| 2011/0053485 A1 | 3/2011 | Huang et al. | |

(Continued)

*Primary Examiner* — Gregory Huson
*Assistant Examiner* — Dana Tighe
(74) *Attorney, Agent, or Firm* — Trop, Pruner & Hu, P.C.

(57) ABSTRACT

In one embodiment, a rack enclosure for housing rack-mounted equipment includes a deflection member adapted to a piece of the rack-mounted equipment and an actuator coupled to the deflection member to control a position of the deflection member between a fully closed position and a fully opened position. A variable amount of cooling airflow is to be provided to the equipment piece based on the deflection member position.

13 Claims, 4 Drawing Sheets

(56) References Cited

U.S. PATENT DOCUMENTS

| | | |
|---|---|---|
| 2012/0012278 A1 | 1/2012 | Noteboom et al. |
| 2012/0024502 A1 | 2/2012 | Khalifa et al. |
| 2012/0100798 A1* | 4/2012 | Bermudez ......... E04F 15/02405 454/338 |
| 2012/0156981 A1* | 6/2012 | Curtin ................ H05K 7/20836 454/184 |

* cited by examiner

FLAP-BASED FORCED AIR COOLING OF DATACENTER EQUIPMENT

BACKGROUND

In a datacenter, there is a large amount of computer equipment of various types including servers, storage devices among many others. Oftentimes this equipment is arranged in a rack. To provide for sufficient cooling for each of the devices, particularly for servers, an individual fan is associated with each server. For example, a central processing unit (CPU) of the server is typically coupled to its own fan to provide for cooling.

While many rack-based enclosures are of a closed design in which the equipment is enclosed within an enclosed enclosure, it is anticipated that future datacenter designs may be of an open frame design such as the open frame described in the Open Compute Project Server Chassis and Triplet Hardware (v. 1.0) specification. As cooling of datacenter equipment consumes electricity and other resources including space considerations, a need exists for improved cooling mechanisms.

SUMMARY OF THE INVENTION

Figure 1:
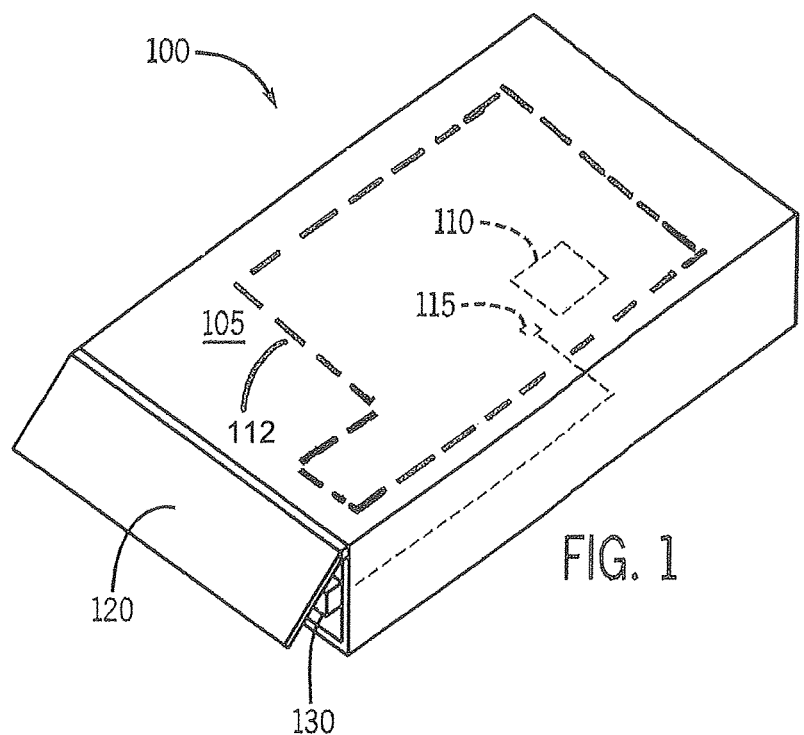
FIG. 1 and FIGS. 1B and 1C are high level block diagrams of a piece of datacenter equipment in accordance with an embodiment of the present invention.

According to one aspect, a rack enclosure for housing rack-mounted equipment includes a deflection member adapted to a piece of the rack-mounted equipment and an actuator coupled to the deflection member to control a position of the deflection member between a fully closed position and a fully opened position. A variable amount of cooling airflow is to be provided to the equipment piece based on the deflection member position.

As one example, the equipment piece is a server configured within a chassis. The deflection member may be adapted to a first face of the chassis via a hinge, where the hinge includes a first gear mechanism interconnected with a second gear mechanism. In an embodiment, the actuator is a stepper motor to control the deflection member position, where the stepper motor is configured to receive a control signal from a fan header of a motherboard of the server. In turn, a microcontroller is configured to receive the control signal and to convert the control signal into a position control signal and to control the stepper motor according to the position control signal, where the control signal is based on a temperature associated with the server. The server may provide the control signal with a first value to cause the deflection member to be in the fully closed position when the temperature is less than a first threshold. In some embodiments, the fan header is unconnected to a fan, and the server does not include any fan.

In another embodiment, a plurality of deflection members may be adapted to the equipment piece, where a first deflection member is adapted to a first face of the chassis and a second deflection member is adapted to a side of the chassis, and a plurality of actuators are each coupled to one of the plurality of deflection members.

In a still further embodiment, the deflection member is a baffle including a plurality of perforated panels movable with respect to each other to cause the variable amount of cooling airflow.

In another aspect, a rack-mounted enclosure includes a plurality of support members each to support a piece of rack-mounted equipment. The rack-mounted enclosure is to receive a flow of cooling air via a first face of the rack-mounted enclosure and to exhaust the cooling air flow via a second face of the rack-mounted enclosure. At least some of the pieces of rack-mounted equipment include a deflection member adapted thereto on the first face and an actuator coupled to the deflection member to control a position of the deflection member between a fully closed position and a fully opened position. In this way, a variable amount of the cooling air flow is to be provided to the equipment piece based on the deflection member position. In an embodiment, the rack-mounted enclosures are configured in a ring of racks, and an exhaust port within an interior of the ring of racks is to exhaust the cooling air flow.

According to another aspect, a method includes: receiving a control signal for control of a fan of a piece of datacenter equipment in a controller, where the piece of equipment does not include the fan; converting the control signal into a position control signal, in the controller; and communicating the position control signal from the controller to an actuator, to cause a deflection member adapted to the piece of the equipment to be placed into a desired position to enable a selective amount of a cooling airflow to be provided to the piece of equipment. The deflection member may be in a fully closed position when a temperature of the piece of equipment is less than a threshold. In this case, substantially none of the cooling air flow is provided to the piece of datacenter equipment.

DETAILED DESCRIPTION

A cooling system in accordance with an embodiment of the present invention provides the ability to control the amount of air being forced across a piece of datacenter equipment such as a server on a unit basis in relation to its cooling needs at that moment, maximizing cooling efficiency. Accordingly, datacenter equipment that is already within tolerance (e.g., having a temperature below a threshold or specification value) is not cooled, to prevent exhausting cool air and wasting it rather than selectively cooling the equipment having a need for cooling. In this way, as much cool air and energy can be saved as possible.

To provide per server control of cooling, an embodiment may be provided with one or more deflection members, each with an actuator such as a stepper motor attached to it.

As an example the deflection member can be realized by a flap. This flap mounts to the front of a rack-mounted server in place of a conventional faceplate. Note that although described herein as "front" and "rear" sides, understand that more generally embodiments apply to provide a flow of cooling air from one or more inlet sides to one or more outlet sides of a piece of equipment. Some designs may provide for side-to-side, three side to one side or all sides including top and bottom cooling arrangements.

In some embodiments the faceplate on a front side of a chassis can be replaced with a flap (such as aluminum or other lightweight material) that is fastened onto the chassis in an appropriate manner. With variable control of the flap, a variable amount of cold air can flow through the server and out of an exhaust port such as another side of the rack. In an embodiment, the stepper motor or other actuator is connected to the same pin headers as a CPU fan would be. That is, embodiments may avoid the need for a cooling fan within the equipment such as a CPU fan. Then based on a control voltage supplied for what would be the CPU fan, the flap opens or closes a specific amount.

Flap-based forced air cooling in accordance with an embodiment of the present invention is thus a mechanical implementation that can be controlled in a desired manner. Adaptive control of the flap based-forced air cooling control unit can facilitate optimal cooling efficiency. In some embodiments a system-provided voltage signal for control of a fan (not present in the system) can be converted into an opening value for a flap. As an example, a zero volt value may cause the flap to be fully closed, while a 5 volt signal may cause the flap to be fully opened. And for values in between, a linear control algorithm may translate this voltage into an appropriate opening of the flap.

In some embodiments, this control voltage can be generated internally to the equipment such as by an environmental controller or other control mechanism that generates the control signal based on a temperature of the equipment. For example, a server can include one or more internal thermal sensors that provide information to an embedded controller or other control mechanism within the server that generates this control signal, which would otherwise be provided to a fan within the server. Assume in the illustrated embodiment that when the server temperature is below a threshold such as below a low temperature threshold, no cooling is needed and accordingly, the control voltage may be provided at zero volts. Instead when the temperature exceeds a high temperature threshold, full cooling is needed and thus the control voltage can be sent at the high level, e.g., five volts. For conditions between these extremes, a variable control voltage between the low and high values can be sent based on a particular control algorithm performed within the equipment.

In an embodiment, the control of a given flap may be according to the following equation, EQ.1, below:

(((Current Voltage\Max Voltage)*Max Degree Opening)/(mod)Stepper Degree Per Step)−Current Steps=Adjustment Steps. [EQ1]

In this EQ. 1, "current voltage" is a voltage signal received from a fan header and "maximum voltage" is a maximum voltage of the signal. In turn, the "maximum degree opening" is the widest opening of the flap (e.g., 90 degrees), "stepper degree per step" is the number of degrees per step and "current steps" is the current step value. In turn, this leads to a value in terms of "adjustment steps", which is the number of additional steps the stepper motor makes to effect the determined position. In an embodiment, this equation can be implemented within a microcontroller, e.g., of a stepper motor, to enable control of the flaps to an appropriate position depending on temperature of the associated server.

Referring now to FIG. 1, shown is a high level block diagram of a piece of datacenter equipment in accordance with an embodiment of the present invention. For ease of discussion herein, a server is described. However understand that embodiments apply equally to many other types of rack-mounted datacenter equipment including storage devices, switches, and load balancers among many other types of such equipment. In the embodiment shown, server 100 is configured in a chassis 105. Chassis 105 is configured for installation within a rack. In some embodiments, such rack may be of an open frame arrangement such that a flow of cooling air is communicated from one side of the rack to the other across the equipment installed within the rack. Using flap-based cooling as described herein, this flow of cooling air may be modulated to enable selective cooling of particular equipment within the rack that has a need for cooling. Still further, control of flap-based cooling enables a variable amount of cooling airflow across different pieces of equipment within the rack, as described herein. Embodiments thus provide for independent control of forced air cooling through each piece of equipment present within a rack-based enclosure. As such, the amount of needed airflow can be reduced and the cooling costs and power consumption both can be lowered.

Figure 1B:
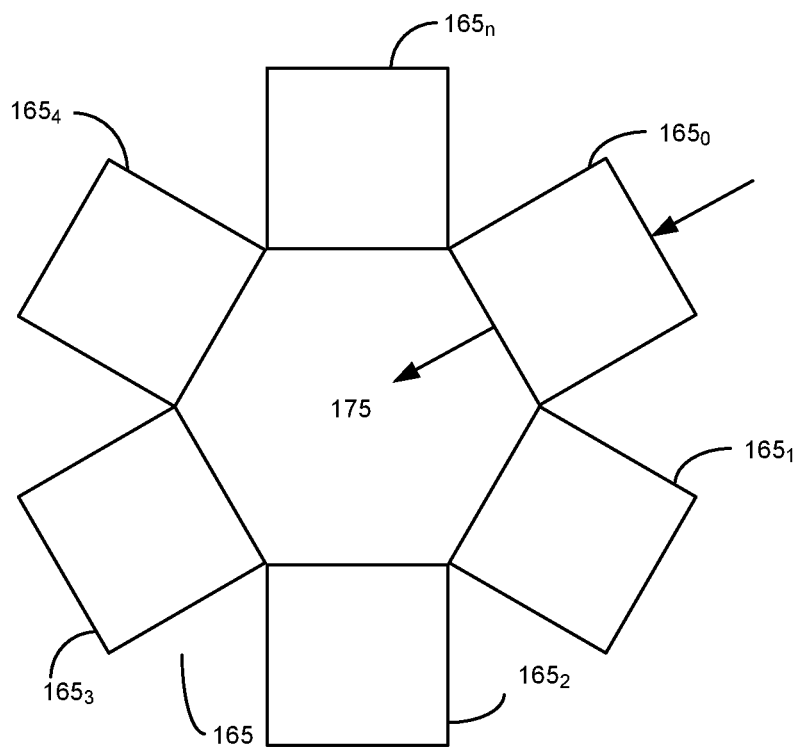

In a particular datacenter implementation, multiple racks can be configured as a ring of racks such that the racks together collectively form a roughly cylindrical frame or shape. In such implementations, the inlet of cooling air may be via the front face of the racks and the exhaust from the rear face of the racks. In turn, an exhaust port may be configured at a top portion of this ring of racks to enable the exhaust airflow to exit from an enclosure including these racks. As shown in FIG. 1B, a top view of a ring of racks 160 includes racks $165_0$-$165_n$, with the direction of cooling air shown by the arrows at rack $165_0$. Also shown in FIG. 1B, an exhaust port 175 is configured at the top portion of ring of racks 160. In this roughly pie-shaped server configuration, the baffles transition a chassis from a generally rectangular shape to a trapezoid shape, varying airflow by increasing the distance of a baffle/pair of baffles from one side of the system (the intake side) while remaining fixed at the other (the exhaust side).

With reference still to FIG. 1, on a front side of chassis 105 a flap 120 is provided that is configured onto the chassis by way of a hinge (not shown for ease of illustration in FIG. 1). In an embodiment, flap 120 may be coupled onto an existing chassis 105, e.g., via a clip, magnet or other fastening mechanism. To effect selective control of cooling air through a portion of the rack including chassis 105, a stepper motor 130 is provided to control the flap.

More specifically as described herein, stepper motor 130 is controlled by way of a microcontroller, e.g., configured as part of the stepper motor or as a separate component coupled to the stepper motor to cause selective control of the flap. As described above, this control may be via a control signal received from a fan header 115 (e.g., a 4 pin header) of a motherboard 112 within chassis 105. Note that this fan header may typically be configured to couple to a fan provided within the chassis that enables cooling of a CPU 110 of the motherboard 112. However, using cooling as described herein the need for a separate fan can be avoided, thus reducing size, cost and power consumption. This fan header 115 is configured to receive a control signal from CPU 110 to cause a fan to spin at an appropriate level based on environmental conditions. Instead here, this control signal (which may be a voltage signal representing a level between zero and 5 volts in an embodiment) can be communicated to provide for control of flap 120. Thus the control signal that conventionally is provided to fan header 115 is re-routed to the microcontroller to enable appropriate control of stepper motor 130. Although shown at this high level in the embodiment of FIG. 1, understand the scope of the present invention is not limited in this regard and various pieces of equipment, configured in different arrangements within a rack can take advantage of embodiments as described herein.

Figure 1C:
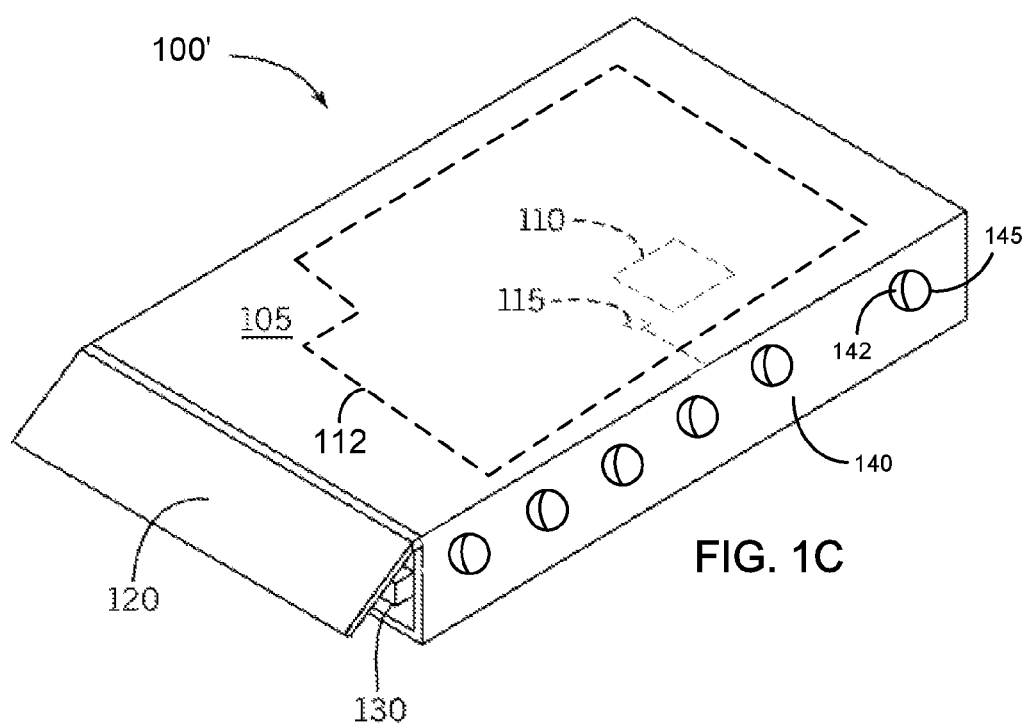

Also understand that other types of deflection members are possible. For example, a sliding baffle may be used. This baffle may have multiple perforated panels situated in such a way that when one is slid/offset parallel to the other, the holes misalign, causing a change in the amount of airflow/thermal impedance. This approach can be used on any side of the chassis in long strips or multiple small actuated strips to vary the airflow by sliding the baffle strips into varying positions. Referring now to FIG. 1C, in an alternate server 100' note that a side panel 140 includes perforations 145. Further, although hidden in the view of FIG. 1C, the size of the holes formed by perforations 145 and thus the airflow is varied by sliding of panel 142 to realize a sliding baffle. Different motor designs (single axis "wheels" for instance) could be used to control this.

Figure 2:
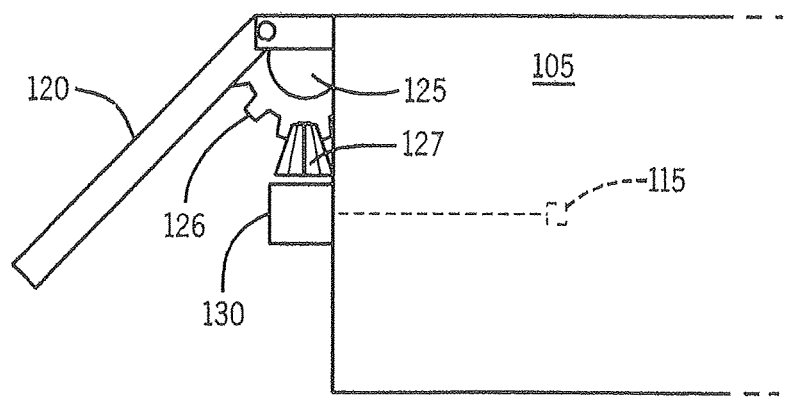
FIG. 2 is a side view illustration of flap-based cooling in accordance with an embodiment of the present invention.

Referring now to FIG. 2, shown is a side view illustration of flap-based cooling as described herein. In this view, a front end of chassis 105 is shown, with a hinge assembly 125 enabling interconnection of flap 130 to chassis 105. More specifically, hinge assembly 125 includes a first gear mechanism 126 to interact with a second gear mechanism 127 that in turn is controlled by stepper motor 130 to enable flap 120 to open to a desired position. In the implementation shown, flap 120 may be controlled to be in any position from a zero degree position (namely in a closed position in which no forced air flows through the chassis) to a fully open position (namely at 90 degrees) in which a full flow of forced air flows through the chassis. And of course based upon a control signal provided from fan header 115, any position between fully open and fully closed can be achieved by appropriate control of stepper motor 130 and hinge assembly 125.

In an embodiment, a microcontroller may discover all variables allowing the system to adapt and work with any hardware available and the results of this positioning can be calculated and passed back to the system for airflow calculation and temperature mapping.

In implementations in which a rack-based controller or datacenter manager receives environmental information regarding each piece of equipment, a mechanism may provide an indication of the amount of opening of the flap. That is, in certain systems when a fan is present, the fan speed is communicated to this controller or manager, along with an indication of a fault, if present. To avoid an indication of a failure due to lack of a fan here, in some embodiments the microcontroller that performs the conversion of the voltage control signal into a degree fan opening can further convert this voltage control signal into an appropriate fan speed (if such fan were present) to enable communication of this fan speed value to the appropriate entity.

Although the implementation shown in FIG. 1 is with regard to flap-based cooling in which the flap is located on a front side of a chassis or other piece of datacenter equipment, understand that embodiments are not limited in this regard. For example instead the flap can be located on a rear portion of the chassis. Still further, in certain implementations multiple flaps may be provided. As an example, to provide targeted air flow into different parts of a piece of equipment such as where a server has multiple hot spots including CPUs, storage devices, some flaps may be located on side portions of the chassis to enable airflow to be targeted at various portions of the piece of equipment.

Figure 3:
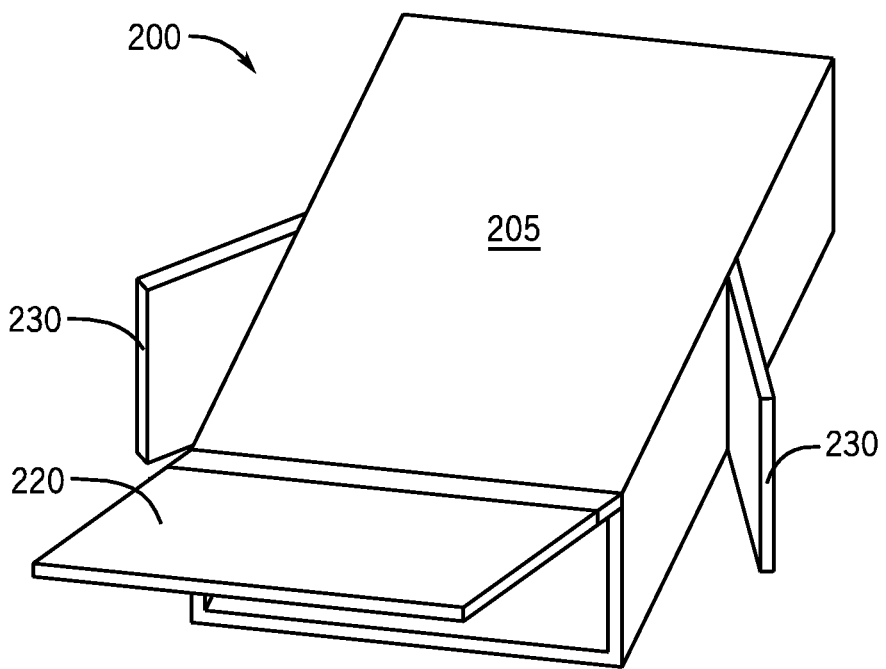
FIG. 3 is an implementation of a chassis having multiple cooling flaps in accordance with an embodiment of the present invention.

Referring now to FIG. 3, shown is an implementation of a chassis having multiple cooling flaps in accordance with an embodiment of the present invention. As shown in FIG. 3, server 200 includes a chassis 205 that has a first flap 220 configured on a front portion of the chassis as described above. In addition, two side flaps 230 are provided, one on each side of the chassis to enable targeted airflow to pass along components located close to these flaps. In general, these flaps may be configured the same as discussed above, with a hinge-based connection onto the chassis and control by a stepper motor and microcontroller, which may be configured to receive the same voltage control signal. Instead in other embodiments, different control signals, e.g., as communicated by an environmental controller or other entity, may be provided to these different microcontrollers to enable each of the flaps to operate at different positions based on measured temperature values around the components located near these different flaps. Although shown at these particular locations in the embodiment of FIG. 3, understand the scope of the present invention is not limited in this regard.

Figure 4:
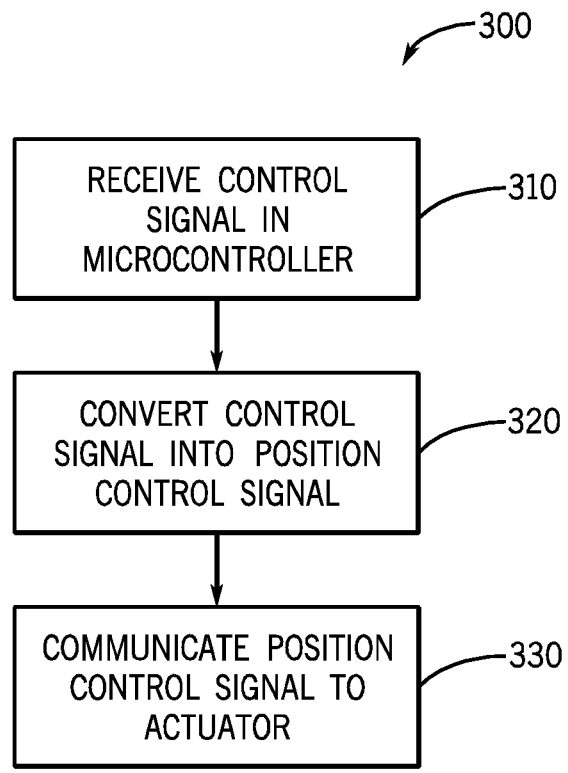
FIG. 4 is a flow diagram of a method for controlling a cooling system in accordance with an embodiment of the present invention.

Referring now to FIG. 4, shown is a flow diagram of a method of controlling a cooling system in accordance with an embodiment of the present invention. As shown in FIG. 4, method 300, which can be performed by a microcontroller associated with a stepper motor or other actuator, begins by receiving a control signal (block 310). As discussed above, this control signal may be a conventional fan control signal generated based on one or more temperatures associated with a piece of datacenter equipment.

Responsive to this received control signal, the microcontroller converts it into a position control signal (block 320). In an embodiment, this conversion may be performed in accordance with EQ. 1, as described above. Of course other algorithms to generate a position control signal from a received voltage control signal are possible in other embodiments.

This position control signal can be communicated to the actuator (block 330). In the illustrated embodiment above, this position control signal may correspond to an appropriate position for the stepper motor such that the stepper motor operates to place the flap into the appropriate position to enable a selective amount of cooling to be passed to the associated equipment based on actual temperature of the equipment. Although shown at this high level in the embodiment of FIG. 4, understand the scope of the present invention is not limited in this regard.

Embodiments may be implemented in code and may be stored on a non-transitory storage medium having stored thereon instructions which can be used to program a system to perform the instructions. The storage medium may include, but is not limited to, any type of non-transitory storage medium suitable for storing electronic instructions.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:
1. An apparatus comprising:
a deflection member adapted to a piece of rack-mounted equipment within a rack enclosure, the rack-mounted equipment comprising a server configured within a chassis; and
an actuator coupled to the deflection member to control a position of the deflection member between a fully closed position and a fully opened position, wherein a variable amount of cooling airflow is to be provided to the piece of rack-mounted equipment based on the deflection member position, wherein the actuator comprises a stepper motor to control the deflection member position, the stepper motor to receive a control signal from a fan header of a motherboard of the server, the control signal to provide for control of a fan, wherein the fan header is unconnected to the fan, the server not including any fan and the deflection member comprises a baffle including a plurality of perforated panels movable with respect to each other to cause the variable amount of cooling airflow.

2. The apparatus of claim 1, wherein the deflection member is adapted to a first face of the chassis via a hinge.

3. The apparatus of claim 2, wherein the hinge comprises a first gear mechanism interconnected with a second gear mechanism.

4. The apparatus of claim 1, further comprising a microcontroller to receive the control signal and to convert the control signal into a position control signal and to control the stepper motor according to the position control signal.

5. The apparatus of claim 4, wherein the control signal is based on a temperature associated with the server.

6. The apparatus of claim 5, wherein the fan header is to provide the control signal with a first value to cause the deflection member to be in the fully closed position when the temperature is less than a first threshold.

7. The apparatus of claim 1, further comprising a plurality of deflection members adapted to the piece of rack-mounted equipment, wherein a first deflection member is adapted to a first face of the chassis and a second deflection member is adapted to a side of the chassis, and a plurality of actuators each coupled to one of the plurality of deflection members.

8. A rack-mounted enclosure comprising:
a plurality of support members each to support a piece of rack-mounted equipment, the rack-mounted enclosure to receive a flow of cooling air via a first face of the rack-mounted enclosure and to exhaust the cooling air flow via a second face of the rack-mounted enclosure, wherein at least some of the pieces of rack-mounted equipment comprise a server including a deflection member adapted thereto on the first face and an actuator coupled to the deflection member to control a position of the deflection member between a fully closed position and a fully opened position, wherein the actuator comprises a stepper motor to control the deflection member position, the stepper motor associated with a microcontroller to receive a control signal from a fan header of a motherboard of the server, wherein the fan header is unconnected to a fan, the server not including any fan, the control signal provided by a central processing unit of the server for fan control, wherein the control signal is re-routed to the microcontroller and the microcontroller is to convert the control signal into a position control signal and control the stepper motor according to the position control signal, wherein a variable amount of the cooling air flow is to be provided to the piece of rack-mounted equipment based on the deflection member position; and
a plurality of rack-mounted enclosures each including a plurality of rack-mounted pieces of equipment, at least some of the rack-mounted pieces of equipment including a deflection member adapted to the corresponding rack-mounted pieces of equipment, wherein the plurality of rack-mounted enclosures are configured in a ring of racks.

9. The rack-mounted enclosure of claim 8, wherein the server is configured within a chassis and the deflection member is adapted to the first face of a chassis via a hinge.

10. The rack-mounted enclosure of claim 8, further comprising an exhaust port within an interior of the ring of racks to exhaust the cooling air flow.

11. A method comprising:
receiving a control signal for control of a rotational level of a fan of a piece of datacenter equipment in a controller, wherein the piece of equipment does not include the fan, the control signal re-routed from a pin header of the datacenter equipment to the controller;
converting the control signal into a position control signal, in the controller; and
communicating the position control signal from the controller to an actuator, to cause a deflection member adapted to the piece of datacenter equipment to be placed into a desired position to enable a selective amount of a cooling airflow to be provided to the piece of datacenter equipment.

12. The method of claim 11, further comprising causing the deflection member to be in a fully closed position when a temperature of the piece of datacenter equipment is less than a threshold.

13. The method of claim 12, wherein substantially none of the cooling air flow is provided to the piece of datacenter equipment when the deflection member is in the fully closed position.

* * * * *